(12) United States Patent
Kau et al.

(10) Patent No.: US 7,087,943 B2
(45) Date of Patent: Aug. 8, 2006

(54) DIRECT ALIGNMENT SCHEME BETWEEN MULTIPLE LITHOGRAPHY LAYERS

(75) Inventors: Derchang Kau, Cupertino, CA (US); Khaled Hasnat, San Jose, CA (US); Everett Lee, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 239 days.

(21) Appl. No.: 10/435,495

(22) Filed: May 8, 2003

(65) Prior Publication Data
US 2004/0224262 A1    Nov. 11, 2004

(51) Int. Cl.
*H01L 27/10* (2006.01)
*H01L 29/73* (2006.01)

(52) U.S. Cl. .............................. 257/206; 257/E27.013; 257/E29.026; 257/E23.07

(58) Field of Classification Search ................ 257/206, 257/E27.013, E29.026, E23.07
See application file for complete search history.

(56) References Cited

U.S. PATENT DOCUMENTS

| | | | | |
|---|---|---|---|---|
| 4,830,977 A | * | 5/1989 | Katto et al. .................. | 438/587 |
| 4,896,302 A | * | 1/1990 | Sato et al. ............. | 365/230.06 |
| 5,287,307 A | * | 2/1994 | Fukuda et al. ......... | 365/189.06 |
| 5,333,122 A | * | 7/1994 | Ninomiya ............... | 365/189.11 |
| 5,340,762 A | * | 8/1994 | Vora ........................... | 438/207 |
| 5,615,150 A | * | 3/1997 | Lin et al. ................ | 365/185.17 |
| 5,668,389 A | * | 9/1997 | Jassowski et al. .......... | 257/207 |
| 5,742,099 A | * | 4/1998 | Debnath et al. ............. | 257/758 |
| 5,973,356 A | * | 10/1999 | Noble et al. ................ | 257/319 |
| 6,006,024 A | * | 12/1999 | Guruswamy et al. ......... | 716/12 |
| 6,034,886 A | * | 3/2000 | Chan et al. ................. | 365/154 |
| 6,143,600 A | * | 11/2000 | Takaishi ..................... | 438/253 |
| 6,236,618 B1 | * | 5/2001 | Roy ....................... | 365/230.06 |
| 6,791,128 B1 | * | 9/2004 | Yamauchi ................... | 257/206 |
| 6,888,730 B1 | * | 5/2005 | Foss et al. .................... | 365/49 |
| 2002/0079515 A1 | * | 6/2002 | Kuwazawa ................ | 257/204 |

FOREIGN PATENT DOCUMENTS

JP          04-256356     *  9/1992

OTHER PUBLICATIONS

VLSI Technology, edited by S.M. Sze, Copyright 1983—Bell Laboratories, Incorporated, Murray Hill, New Jersey; McGraw-Hill Book Company; ISBN 0-07-062686-3, McGraw-Hill series in electrical engineering, Electronics and electronic circuits; Lithography pp. 273-274.

* cited by examiner

*Primary Examiner*—W. David Coleman
(74) *Attorney, Agent, or Firm*—Fish & Richardson P.C.

(57) ABSTRACT

A method for directly aligning multiple lithography masking layers. The method may be used to fabricate a flash plus logic structure. The flash plus logic structure may comprise a flash memory cell, a logic cell and a transistor.

12 Claims, 2 Drawing Sheets

DIRECT ALIGNMENT SCHEME BETWEEN MULTIPLE LITHOGRAPHY LAYERS

BACKGROUND

"Flash plus logic" integration refers to flash memory and logic, such as a static random access memory (SRAM) cells and/or transistors, formed on a shared substrate. Flash memory may typically have wordlines and bitlines to access flash memory cells. SRAM may also have wordlines and bitlines. A transistor may have a source, a gate and a drain.

A flash plus logic fabrication process may use a "pattern registration" model, which is described on pages 273–274 in "Lithography" in VLSI Technology by D. A. McGillis published in 1983. The pattern registration model is commonly used in many semiconductor planar processes. In a mask alignment scheme of a typical semiconductor planar process, "registration" refers to a process and/or accuracy of an upper masking layer aligning to an underlining mask layer. The underlining mask layer is called a "registered" layer and is formed before the upper "registering" mask layer.

DETAILED DESCRIPTION

The "pattern registration" model may be based on a registration tolerance requirement of component location variations in a nesting mask alignment scheme between two or more mask layers. The magnitude of a nesting tolerance may depend on several factors, such as:

- edge uncertainty of the registered layer;
- edge uncertainty of the registering layer; and
- overlay uncertainly of the alignment system, e.g., a lithography tool.

A registering layer may be "directly" or "indirectly" aligned to a registered layer. A top registering layer is "directly" aligned to an underlining registered layer when there are no intermediate layers. "Indirect" alignment may have a nesting tolerance between layers that are registered via one or more intermediate layers. For example, a second layer is directly aligned to an underlining first layer. A third layer is directly aligned to the second layer. The third layer is "indirectly" aligned to the first layer.

The estimated nesting tolerance of a "direct" alignment scheme, $T_D$, may be modeled as:

$$T_D = n \bullet \sqrt{\left(\frac{\sigma_{F1}}{2}\right)^2 + \left(\frac{\sigma_{F2}}{2}\right)^2 + \sigma_r^2}$$

where $\sigma_{F1}$ and $\sigma_{F2}$ are 1-sigma variations of feature size distribution of the registered mask layer and the registering mask layer, respectively. Feature size distribution may also be called CD (Critical Dimension) distribution, which refers to the feature size of a mask. $\sigma_r$ is 1-sigma variation of registration distribution of an alignment process. n is the number of sigma required for the tolerance distribution.

The estimated nesting tolerance of an "indirect" alignment scheme, $T_I$ may be expressed as:

$$T_I = n \bullet \sqrt{\left(\frac{\sigma_{F1}}{2}\right)^2 + \left(\frac{\sigma_{F2}}{2}\right)^2 + \sum_1^i \sigma_{r_i}^2}$$

where "i" is the number of alignment steps in the "indirect" alignment scheme.

Figure 1:
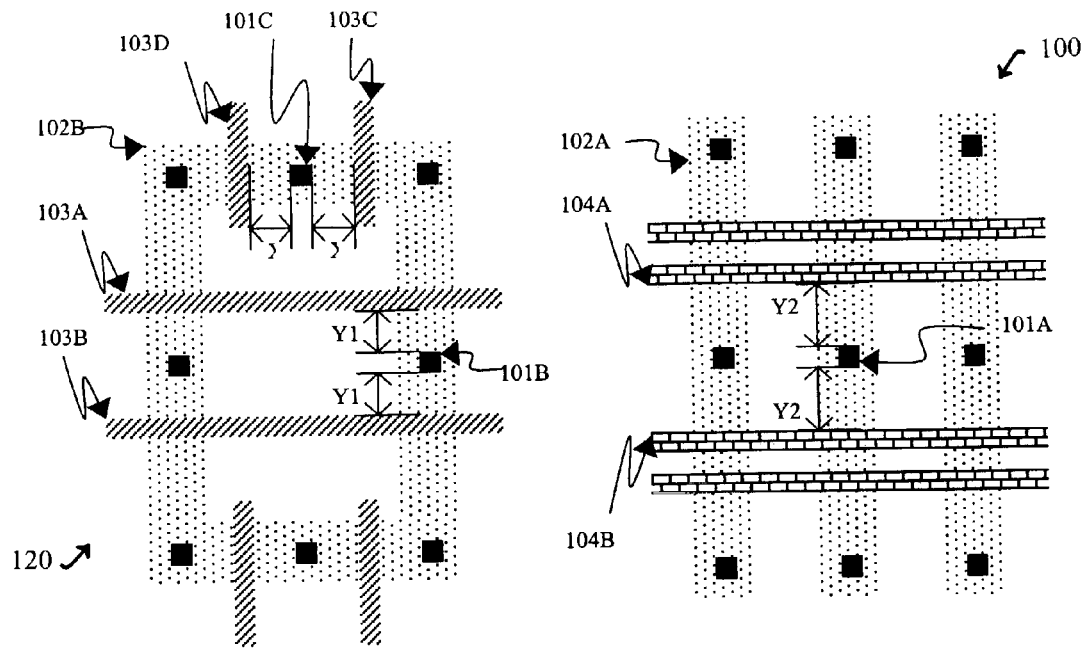
FIG. 1 illustrates a dual polysilicon patterning scheme with a flash memory cell plus logic on a shared substrate.

FIG. 1 illustrates a dual polysilicon patterning scheme with a flash memory cell 100 plus logic 120 ("flash+logic") on a shared substrate. The flash memory cell 100 may be part of a flash memory array. The flash memory plus logic configuration 100, 120 may be formed by (a) forming a diffusion layer 102 on a substrate, (b) forming a first polysilicon masking layer 104 called "SMS" (Self-aligned MoS, which may also be called "SAMOS"), (c) forming a second polysilicon masking layer 103 called "PLY," (d) optionally depositing a thin layer of Nitride serving as a contact Etch Stop Layer (called "NESL") to improve contact etch selectivity, (e) depositing a dielectric layer, e.g., silicon dioxide, over the entire wafer surface, (f) forming a contact masking layer 101 (photoresist with openings for desired contact locations 101A–101C) for contact etch process, (g) etching through dielectric (silicon dioxide) and NESL layers where contact layer 101 has openings, and (h) filling the etched contact openings with metal, such as tungsten, alumina or copper. The first polysilicon masking layer 104 may be directly aligned to the underlining diffusion layer 102. The second masking polysilicon layer 103 may be directly aligned to the first polysilicon masking layer 104. The contact masking layer 101 may be directly aligned to the second masking polysilicon layer 103. In an alternative method, the PLY polysilicon layer 103 may be formed before the SMS polysilicon layer 104.

Each layer may be patterned and etched to define the structures shown in FIG. 1. The diffusion layer 102 may be etched to form diffusion strips and segments 102A, 102B. The SMS polysilicon layer 104 may be etched to form SMS flash memory wordlines 104A, 104B. The PLY polysilicon layer 103 may be etched to form PLY Static Random Access Memory (SRAM) wordlines 103A, 103B and transistor gates 103C, 103D. The contact masking layer 101 may allow a flash bitline contact 101A, a SRAM bitline contact 101B and a transistor bitline contact 101C to be formed as explained above.

"PLY" is used to distinguish the second polysilicon layer (forming SRAM polysilicon wordlines 103A, 103B and transistor gates 103C, 103D) from the first "SMS" polysilicon layer (forming the flash wordlines 104A, 104B). Other materials besides polysilicon may be used.

The flash memory cell 100 in figure may include a flash bitline contact 101A, a flash diffusion layer 102A in the form of a strip, and flash wordlines 104A, 104B. Each wordline 104A, 104B is a row of flash control gates for a plurality of memory cells.

The logic 120 in FIG. 1 may include an SRAM bitline contact 101B, a transistor source/drain (S/D) contact 101C, an SRAM diffusion layer 102B in the form of a rectangle, SRAM wordlines 103A, 103B and transistor gates 103C, 103D.

Alignment may typically be done layer-by-layer, not feature-by-feature. The integrated flash plus logic pattern 100, 120 in FIG. 1 may have (a) the contact layer 101

"directly" aligned to the PLY polysilicon layer 103, and (b) the contact layer 101 "indirectly" aligned to the SMS polysilicon layer 104. For a dual polysilicon patterning scheme in a technology like flash plus logic, state-of-the-art stack gate spaces "Y2" between the flash bitline contact 101A and wordlines 104A, 104B and spaces "Y1" between the SRAM bitline contact 101B and wordlines 103A, 103B may typically be different by about 10%. This may be a problem, as described below.

The contact layer 101 may be referred to as "un-landed." "Un-landed" is generally used to contrast a conventional contact process which is "fully-landed" on a diffusion layer and a polysilicon layer. A "fully-landed" contact layer is completely enclosed by (or in contact with) landing layers, e.g., a diffusion layer and a polysilicon layer, with all sources of variation in a fabrication process. The "un-landed" contact layer 101 may be partially landed on a diffusion layer and/or a polysilicon layer in fabrication processes. "Registration" of the contact layer 101 may refer to "directly" aligning the "un-landed" contact layer 101 to the logic-based PLY polysilicon gate layer 103 or the flash-based SMS polysilicon gate layer 104 in flash-plus-logic integration.

An additional "contact-to-gate" registration requirement of the "un-landed" contact layer 101 in a flash-plus-logic process may be a problem. While maintaining a tight registration capability (specification) of the contact layer 101 with "direct" alignment to one gate layer (PLY layer 103 with SRAM wordlines and transistor gates 103A–103D to specify contact-to-gate spaces Y1 and X), the contact-to-gate space Y2 for "indirect" alignment to the SMS flash wordlines 104A, 104B of the SMS layer 104 may be larger. For example, Y2 may be larger than X or Y1 by about 10 to 40%. This may result in a different design rule for flash-plus-logic technology compared to flash-only or logic-only technologies, which may be undesirable.

A problem to solve is how to use the same design rule for flash-only and flash-plus-logic technology. A possible solution to the problem is to increase contact-to-flash wordline space Y2 for a flash-plus-logic process to accommodate "indirect" alignment registration, while maintaining the contact-to-SRAM wordline space Y1 to accommodate "direct" alignment registration requirement. The increase in contact-to-flash (contact-to-SMS) wordline space Y2 required by flash-plus-logic technology due to indirect alignment may be addressed by one of the following two approaches. Flash-only technology may produce a larger foot print than its capability (specification). Increasing flash cell size may result in an undesirable die size increase.

Alternatively, the increase in contact-to-flash wordline space Y2 may be accomplished by reducing flash wordline width through additional process development, which may result in an undesirable increase in overall process development cycle time and/or complexity.

The spaces X and Y1 may meet the requirement of "direct" alignment nesting tolerance, which may be expressed as:

$$X = Y_1 = n \bullet \sqrt{\left(\frac{\sigma_{CON}}{2}\right)^2 + \left(\frac{\sigma_{PLY}}{2}\right)^2 + \sigma_r^2}$$

where $\sigma_{CON}$ and $\sigma_{PLY}$ are 1-sigma variations of feature size distribution of a contact mask layer and a PLY mask layer, respectively. $\sigma_r$ is 1-sigma variation of registration distribution of an alignment process. n is the number of sigma required for the tolerance distribution.

Contact-to-SMS nesting tolerance, Y2, may be expressed as:

$$Y_2 = n \bullet \sqrt{\left(\frac{\sigma_{CON}}{2}\right)^2 + \left(\frac{\sigma_{SMS}}{2}\right)^2 + 2 \bullet \sigma_r^2}$$

at best due to "indirect" alignment of the contact layer 101 to the SMS polysilicon layer 104. $\sigma_{CON}$ and $\sigma_{SMS}$ are 1-sigma variations of feature size distribution of a contact mask layer 101 and the SMS mask layer 104, respectively.

Figure 2:
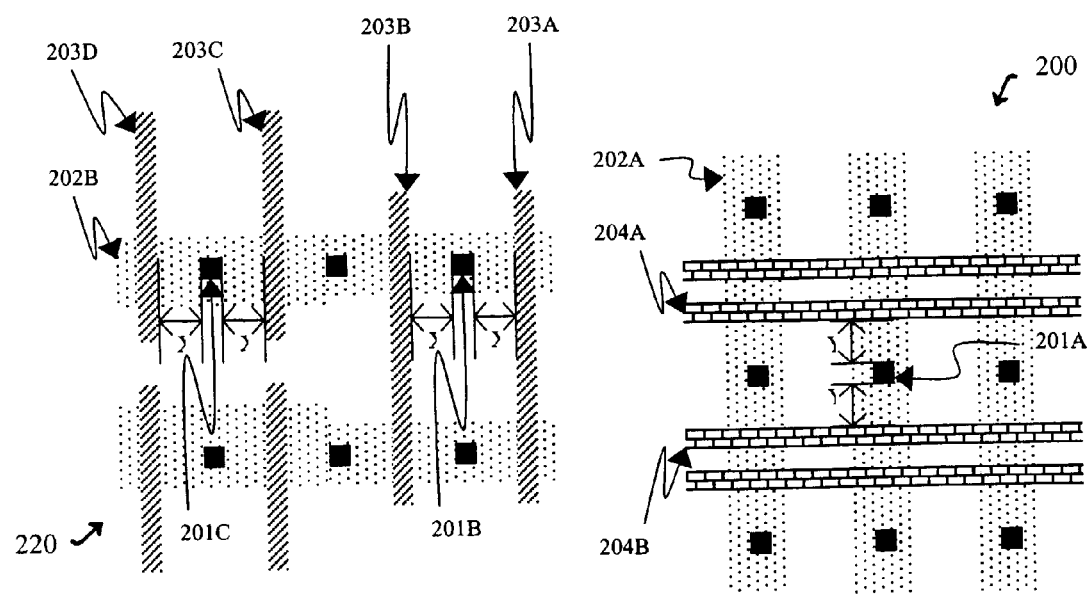
FIG. 2 illustrates a flash plus logic configuration on a shared substrate in accordance with an embodiment of the present application.

FIG. 2 illustrates a flash 200 plus logic 220 configuration on a shared substrate in accordance with an embodiment of the present application. A flash memory cell 200 in FIG. 2 may have a flash bitline contact 201A, a flash diffusion layer 202A in the form of a strip, and "SMS" flash wordlines 204A, 204B. The logic 220 in FIG. 2 may include an SRAM bitline contact 201B, a transistor source/drain (S/D) contact 201C, an SRAM diffusion layer 202B in the form of a strip, "PLY" SRAM wordlines 203A, 203B and PLY transistor gates 203C, 203D. The configuration of FIG. 2 may be used to produce an embedded flash product.

Figure 3:
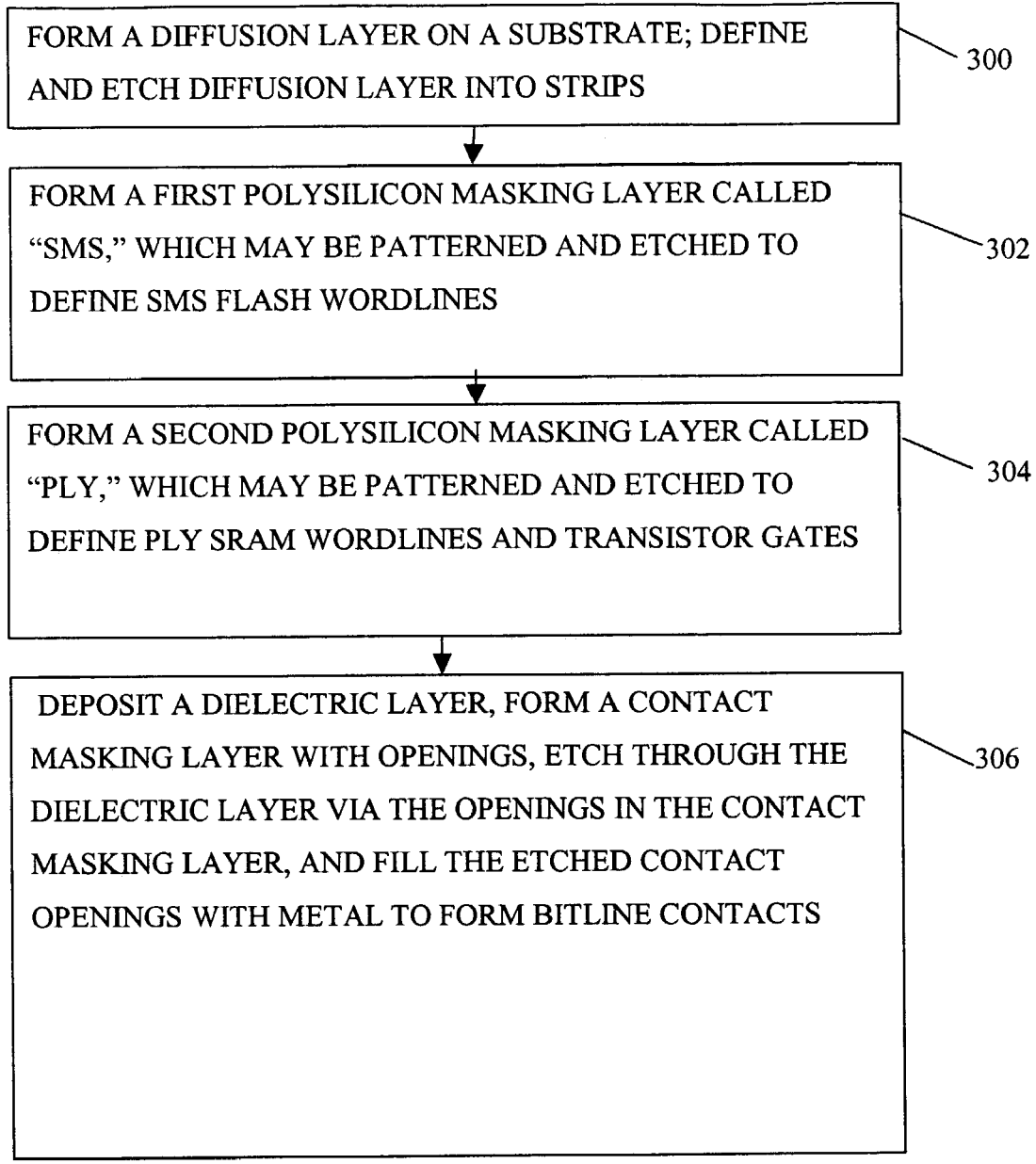
FIG. 3 illustrates an example of a method for forming the flash plus logic configuration in FIG. 2.

FIG. 3 is a flow diagram of a method for forming the flash 200 plus logic 220 configuration in FIG. 2. The method may form a diffusion layer 202 on a substrate at 300. A lithography tool may form a pattern on the diffusion layer 202, which is etched to define the flash diffusion strips 202A and SRAM diffusion strips 202B as shown in FIG. 2. The method may form a first polysilicon masking layer 204 called "SMS," which may be patterned and etched to define SMS flash wordlines 204A, 204B at 302. The method may form a second polysilicon masking layer 203 called "PLY," which may be patterned and etched to define PLY SRAM wordlines 203A, 203B and transistor gates 203C, 203D at 304. The method may then optionally deposit a NESL layer, deposit a dielectric layer, form a contact masking layer 201 with openings, etch through the dielectric layer via the openings in the contact masking layer, and fill the etched contact openings with metal to form the flash bitline contact 201A, SRAM bitline contact 201B and transistor bitline contact 201C at 306. The PLY masking layer 203 is directly aligned to the SMS masking layer 204, and the contact layer 201 is directly aligned to both the SMS and PLY layers 204, 203. In an alternative method, the PLY polysilicon layer 203 may be formed before the SMS polysilicon layer 204.

The improved alignment method of FIG. 3 to form flash memory plus logic may reduce a registration requirement of contacts 201A, 201B, 201C to gates 204A, 204B, 203A–203B, 203C–203D. The new contact alignment method may "directly" align the contact layer 201 (used to form contacts 201A, 201B, 201C) simultaneously to the SMS layer 204 and the PLY layer 203 (used to form flash wordlines 204A–204B, SRAM wordlines 203A–203B, and PLY transistor gates 203C–203D). The method may use orthogonally orientated gates between SRAM and flash cells 220, 200. For example, the method may:

orient the SMS flash wordlines 204A, 204B, in a first direction, e.g., horizontal or X-direction in FIG. 2;

orient the PLY SRAM wordlines 203A, 203B and transistor gates 203C, 203D in a second direction perpendicular to the first direction, e.g., vertical or Y-direction; and directly align the contact layer to the SMS layer 204 in the Y-direction and directly align the contact layer 201 to the PLY layer 203 in the X-direction. Thus, the SMS flash wordlines 204A–204B may be orthogonally placed with respect to the PLY SRAM wordlines 203A, 203B and PLY transistor gates 203A–203D.

The structure of FIG. 2 and method of FIG. 3 may have several benefits and advantages. SRAM wordlines 203A, 203B and logic gates 203C, 203D are parallel and may be formed in the same masking layer and etch process. Two layers with direct alignment (201 and 203; 201 and 204) may be implemented instead of three layers 101, 104, 103 with indirect alignment, as in FIG. 1.

The method above may allow the same spacing between a flash wordline stack and an SRAM wordline stack, i.e., X=Y in FIG. 2. A wordline "stack" is a layout of repeated wordlines in a constant pitch. The registration requirement of contact-to-PLY (contact layer 201 to PLY layer 203) may be reduced from two dimensions (Y1 and X in FIG. 1) to one dimension (X in FIG. 2).

Due to independent alignment in orthogonal directions of the nesting alignment system, the new contact alignment scheme may simultaneously and directly align the flash bitline contact 201A to flash wordlines 204A–204B in the Y-direction and directly align the contacts 201B, 201C to the PLY SRAM wordlines and transistor gates 203A–203D in the X-direction. Therefore, nesting tolerance of both X and Y may meet the minimum space of a "direct" alignment scheme. X and Y may be expressed as:

$$X = Y = n \bullet \sqrt{\left(\frac{\sigma_{CON}}{2}\right)^2 + \left(\frac{\sigma_{GATE}}{2}\right)^2 + \sigma_r^2}$$

A device fabricated by the method above may have:
two distinct layers, such as SMS and PLY in an embedded flash product, which has features orthogonally placed with respect to each other; and
identical spaces Y, X between the stacked features of each of the two distinct layers 203, 204, which allow the feature placement of a third layer 201, such as a contact layer 201.

The methods described herein may be based on (a) the independent alignment capability and requirement of the nesting tolerance model in orthogonal directions and (b) orthogonally oriented SMS flash wordlines 204A, 204B, and PLY SRAM wordlines 203A, 203B. A contact layer 201 thus aligns to SMS and PLY layers 204, 203 independently without the penalty of indirect alignment tolerance between three layers (FIG. 1).

Reduction of a registration requirement may be close to about 40%, and die size improvement due to stack gate pitch reduction may be about 4%. The methods described herein may also share learning between flash and logic technologies for porting on to flash-plus-logic without incremental yield ramp requirement in contact-to-gate capability. In addition, the methods may take advantage of registration capabilities of a lithography tool for both flash and SRAM cell sizes in an integrated flash-plus-logic process. This may help reduce cell sizes.

A number of embodiments have been described. Nevertheless, it will be understood that various modifications may be made without departing from the spirit and scope of the application. Accordingly, other embodiments are within the scope of the following claims.

What is claimed is:
1. An apparatus comprising:
a patterned memory layer that includes a memory cell having a first set of wordlines;
a patterned logic layer that includes a logic cell having a second set of wordlines that is perpendicular to the first set of wordlines; and
a contact via that passes through at least one of the patterned memory layer and the patterned logic layer,
wherein the patterned memory layer and the patterned logic layer share a common substrate, and
wherein a spacing between the contact via and a first wordline in the first set of wordlines in the memory layer is substantially equal to a spacing between the contact via and a second wordline in the second set of wordlines in the logic cell.

2. The apparatus of claim 1, wherein the logic cell comprises a static random access memory.

3. The apparatus of claim 1, wherein the spacing between the contact via and the first wordline in the first set of wordlines in the memory layer is substantially equal to a spacing between the contact via and a logic gate in the logic layer.

4. The apparatus of claim 1, wherein the memory cell and the logic cell have nesting tolerances of $$X = Y = n \bullet \sqrt{\left(\frac{\sigma_{CON}}{2}\right)^2 + \left(\frac{\sigma_{GATE}}{2}\right)^2 + \sigma_r^2}$$

5. The apparatus of claim 1, further comprising:
a diffusion layer that includes
a first diffusion layer strip associated with the memory cell, and
a second diffusion layer strip associated with the logic cell,
wherein the first diffusion layer strip is perpendicular to the second diffusion layer strip.

6. The apparatus of claim 1, wherein:
the patterned memory layer comprises a first layer of gate material including polysilicon;
the patterned logic layer comprises a second layer of gate material including polysilicon; and
the apparatus further comprises a dielectric layer above the first layer of gate material and the second layer of gate material.

7. An apparatus comprising:
a patterned memory layer that includes a memory cell having a first set of wordlines;
a patterned logic layer that includes a logic cell having a second set of wordlines that is perpendicular to the first set of wordlines; and
a contact via that passes through at least one of the patterned memory layer and the patterned logic layer,
wherein the patterned memory layer and the patterned logic layer share a common substrate, and
wherein the memory cell comprises a flash memory cell.

8. An apparatus comprising:
a patterned memory layer that includes a memory cell having a first set of wordlines;
a patterned logic layer that includes a logic cell having a second set of wordlines that is perpendicular to the first set of wordlines; and
a contact via that passes through at least one of the patterned memory layer and the patterned logic layer,
wherein the patterned memory layer and the patterned logic layer share a common substrate, and wherein a spacing between the contact via and a first wordline in the first set of wordlines in the memory layer is substantially equal to a spacing between the contact via and a logic gate in the logic layer.

9. The apparatus of claim 6, further comprising a diffusion layer that includes a first set of strips and a second set of strips, the first set of strips being perpendicular to the second set.

10. An apparatus comprising:
a first patterned layer formed on a substrate, the first patterned layer including a wordline of a memory cell;
a second patterned layer formed on the substrate, the second patterned layer including logic circuitry having a gate; and
a contact via that passes through at least one of the first patterned layer and the second patterned layer and at least into the other of the first patterned layer and second patterned layer, the contact via being positioned adjacent the wordline in the first patterned layer and the gate in the second patterned layer,
wherein a smallest lateral spacing between the contact via and the adjacent wordline in the first patterned layer is smaller than the nesting tolerance of an indirect alignment scheme, and
wherein a smallest lateral spacing between the contact via and the adjacent gate in the second patterned layer is smaller than the nesting tolerance of an indirect alignment scheme.

11. The apparatus of claim 10, wherein the memory cell comprises a flash memory cell.

12. An apparatus comprising:
a first patterned layer formed on a substrate, the first patterned layer including a collection of wordlines of one or more memory cells;
a second patterned layer formed on the substrate, the second patterned layer including logic circuitry having a collection of gates, the collection of gates being perpendicular to the collection of wordlines of the memory cell; and
a third patterned layer formed on the substrate, the third patterned layer including a contact via to provide electrical contact to the substrate.

* * * * *